United States Patent [19]

Ayer

[11] Patent Number: 4,509,102

[45] Date of Patent: Apr. 2, 1985

[54] VOLTAGE CONTROLLED CURRENT SWITCH WITH SHORT CIRCUIT PROTECTION

[75] Inventor: John B. Ayer, Ontario, Canada

[73] Assignee: Canadian Patents & Dev. Limited, Ottawa, Canada

[21] Appl. No.: 473,256

[22] Filed: Mar. 8, 1983

[51] Int. Cl.³ .............................................. H02H 3/24
[52] U.S. Cl. ....................................... 361/92; 361/93; 361/101; 320/48; 340/636
[58] Field of Search .................. 361/92, 93, 100, 101; 320/39, 40, 48; 340/636

[56] References Cited

U.S. PATENT DOCUMENTS

| 3,078,410 | 2/1963 | Thomas | 361/92 X |
| 3,383,580 | 5/1968 | Wallace, Jr. | 320/48 |
| 4,019,112 | 4/1977 | Satoh | 340/636 X |
| 4,021,718 | 5/1977 | Konrad | 320/48 |

Primary Examiner—Reinhard J. Eisenzopf
Attorney, Agent, or Firm—Edward Rymek

[57] ABSTRACT

The battery current switch includes an opto-isolated switch which is controlled to open when the battery voltage falls below a predetermined voltage and/or when the battery load current goes above a predetermined current level.

2 Claims, 1 Drawing Figure

VOLTAGE CONTROLLED CURRENT SWITCH WITH SHORT CIRCUIT PROTECTION

BACKGROUND OF THE INVENTION

This invention is directed to current switches, and in particular, to current switches for batteries.

In order to extend the life of rechargeable lead acid storage batteries, it is important that they be switched off if their operating voltage drops below a predetermined level. It is equally important that they also be switched off when the load current is higher than a predetermined design value due to a short circuit or some other adverse condition.

A large number of circuits have been developed for use with batteries to monitor and control their charging and discharging cycles. Among these are U.S. Pat. No. 3,543,043 which issued to D. L. Dunn on Nov. 24, 1970 and which describes a battery protection circuit which includes a power transistor between the battery and the load; U.S. Pat. No. 3,576,488 which issued to W. J. Zug et al on Apr. 27, 1971 and describes a battery discharge monitor for the terminal voltage of a battery for industrial trucks; U.S. Pat. No. 4,086,525 which issued on O. N. Ibsen et al on Apr. 25, 1981, and which teaches a circuit that senses the rate of discharge and determines a safe discharge voltage for a battery; and U.S. Pat. No. 4,280,097 which issued to R. L. Carey et al on July 21, 1981, and which teaches a system for monitoring the dc voltage of a source while electrically isolated from it.

These systems, though useful for particular applications, do not have all of the attributes desired in a current switch. These include a simple control circuitry, a low quiescent power dissipation, a low "on" resistance of the switch i.e. less than $0.25\Omega$ from half to full load, a low value between "on-off" load voltages, i.e. $<2.5$ V, a high speed short circuit protection of the switch, and an electrical isolation between load and control circuitry.

SUMMARY OF THE INVENTION

It is therefore an object of this invention to provide a voltage controlled current switch having overcurrent and undervoltage protection for a battery.

This and other objects are provided in a battery switch for undervoltage and overcurrent protection. The switch includes an opto-isolated switch with a pair of input signal terminals and a pair of power terminals. The pair of power terminals are connected in series with the battery, a current sensing resistor and a load. A pair of avalanche breakdown diodes are reverse connected in series across the battery. The input signal terminals of the opto-switch are connected across one of the diodes to close the opto-isolated switch when the battery voltage is above a predetermined value and, thus to open the opto-switch when the voltage falls below this value. A further switch senses the current in the series battery-load circuit, this current sensing switch is connected across the input signal terminals to open the opto-isolated switch when the sensed current is above a predetermined value. The sensing switch includes the current sensing resistor in the battery-load circuit and a transistor with its base connected to the resistor and its emitter-collector connected across the input signal terminals.

Many other objects and aspects of the invention will be clear from the detailed description of the drawings.

DETAILED DESCRIPTION

Figure 1:
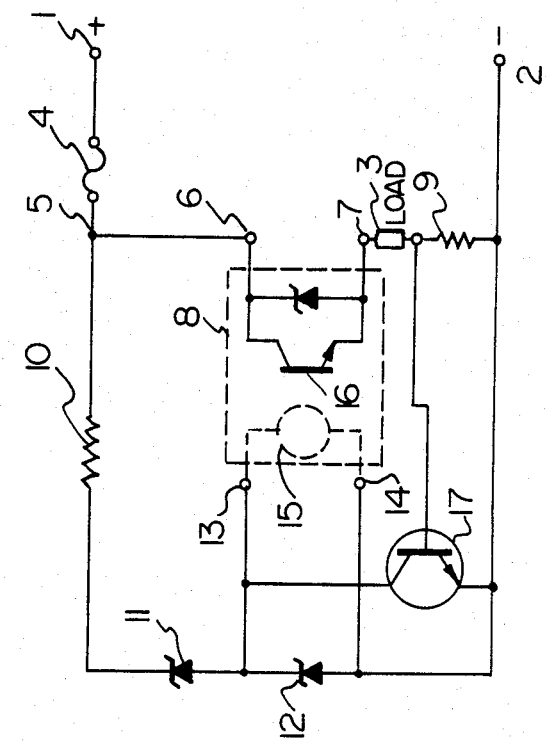
FIG. 1 illustrates the battery current switch in accordance with the present invention.

The controlled current switch in accordance with the present invention is illustrated in FIG. 1. Terminals 1 and 2 represent the positive and negative terminals, respectively, of the battery to be controlled. The load 3 to be connected across the battery terminals 1 and 2 is, as is conventional, connected in series with a fuse 4 and a manual switch 5. In addition, in accordance with the present invention, the power terminals 6, 7 of an opto-isolated switch 8 and a predetermined low value resistor 9 are also connected in series with the load 3 between the battery terminals 1 and 2. The opto-isolated switch 8 may be of the type known as photoisolated, solid state, power relay manufactured by (Crydom) International Rectifier.

The control circuit for the opto-isolation switch 8 includes a second resistor 10 in series with two reverse connected avalanche breakdown or zener diodes 11 and 12. This control circuit is connected across the series power circuit excluding the fuse 4 and the manual switch 5. The voltage across the second diode 12 is connected to the signal input terminals 13 and 14 of the opto-isolated switch 8 which are the terminals for the LED 15 in the switch. The LED 15 controls the optical responsive power transistor 16 in the switch 8. A transistor 17 is connected across terminals 13 and 14 of the switch 8, and the emitter-base terminals of the transistor 17 are connected across resistor 9.

Diodes 11 and 12 are selected so that the sum of their breakdown voltages is the minimum voltage required to provide the full load current by the battery. When the battery load voltage drops below this predetermined value, the current to the LED 15 input of the opto-switch 8 is cut-off by the diode 11 and the opto-switch 8 is de-energized. Access to the battery is thus switched off when the battery voltage is undesirably low. In addition, the resistor 9 produces a voltage at the base of transistor 17 that is proportional to the current through it. When the load current is undesirably high, the voltage across resistor 9 triggers transistor 17 which shorts out the input terminals to the opto-switch 8, thereby opening the opto-switch 8 to protect the battery. A continuous undesirably high load current will activate the fuse 4. For faster action, a circuit breaker may replace the fuse 4.

For a standard 12 volt lead-acid battery, a circuit having the following component values provided protection for voltage below $\sim 10.8$ V, and for currents above $\sim 5.5$ A:

Opto-isolated switch (8)—S430 (Crydom-IR)
Transistor (17)—2N 2219
Resistor (9)—0.1 $\Omega$/3 watts
Resistor (10)—120 $\Omega \pm 5\%$ ¼ W
Diode (11)—Zener $V_z = 5.6$ V
Diode (12)—Zener $V_z = 3.3$ V.

Many modifications in the above described embodiments of the invention can be carried out without departing from the scope thereof and, therefore, the scope of the present invention is intended to be limited only by the appended claims.

I claim:

1. A current source switch for undervoltage and overcurrent protection in combination a circuit having a current source and a load comprising:
- opto-isolated switch means having a pair of input signal terminals and a pair of power terminals, the pair of power terminals being connected in series with the current source and the load;
- a pair of avalanche breakdown diodes reverse connected in series across the current source, the input signal terminals being connected across one of the diodes to close the opto-isolated switch means when the current source voltage is above a predetermined value; and
- switch means for sensing the current in the series current source-load circuit, the sensing switch means being connected across the input signal terminals to open the opto-isolated switch means when the sensed current is above a predetermined value.

2. A current source switch as claimed in claim 1 wherein the sensing switch means includes resistor means in the current source-load circuit and a transistor having a base circuit connected across the resistor means and an emitter-collector connected across the input signal terminals, whereby the voltage developed across the current sensing resistor switches the transistor when the load current exceeds the predetermined value.

* * * * *